United States Patent [19]

Cox et al.

[11] Patent Number: 5,220,170
[45] Date of Patent: Jun. 15, 1993

[54] X-RAY IMAGING SYSTEM AND SOLID STATE DETECTOR THEREFOR

[75] Inventors: John D. Cox; William R. Eisenstadt; Robert M. Fox, all of Gainesville, Fla.

[73] Assignees: General Imaging Corporation; University of Florida, Gainesville, Fla.

[21] Appl. No.: 750,273

[22] Filed: Aug. 27, 1991

Related U.S. Application Data

[63] Continuation-in-part of Ser. No. 462,042, Pat. No. 5,043,582, is a continuation-in-part of Ser. No. 151,235, Feb. 1, 1988, Pat. No. 4,905,265, which is a continuation-in-part of Ser. No. 807,650, Dec. 11, 1985, abandoned.

[51] Int. Cl.$^5$ ............................ G11T 1/20; G11T 1/00
[52] U.S. Cl. ............................ 250/370.09; 250/370.11; 250/366
[58] Field of Search ............... 250/332, 338.4, 349, 250/336.1, 366, 370.08, 370.09, 370.11, 367, 368

[56] References Cited

U.S. PATENT DOCUMENTS

| | | | |
|---|---|---|---|
| 4,067,104 | 1/1978 | Tracy | 250/332 X |
| 4,197,469 | 4/1980 | Cheung | 250/370.08 X |
| 4,543,534 | 9/1985 | Temes et al. | 330/9 |
| 4,560,877 | 12/1985 | Hoffman | 250/370.11 X |
| 4,694,177 | 9/1987 | Akai | 250/370.11 X |

FOREIGN PATENT DOCUMENTS

| | | | |
|---|---|---|---|
| 441521 | 8/1991 | European Pat. Off. | 250/370.09 |
| 57-172273 | 10/1982 | Japan | 250/370.11 |

*Primary Examiner*—Constantine Hannaher
*Assistant Examiner*—Edward J. Glick
*Attorney, Agent, or Firm*—Foley & Lardner

[57] ABSTRACT

The invention comprises a scintillator for converting impinging x-rays into visible light; a sensor array having two opposed surfaces with a plurality of detectors at one of the surfaces and having the other of the surfaces facing the scintillator; and a plurality of processing circuits facing the one surface and connected to the detectors by bump bonds. Another feature of the invention is a gain stage in close proximity to sensors, which may be MOS capacitors. A single gain stage may be connected to one capacitor or may be connected to several at one time.

25 Claims, 7 Drawing Sheets

X-RAY IMAGING SYSTEM AND SOLID STATE DETECTOR THEREFOR

CROSS REFERENCE TO RELATED APPLICATIONS

This is a continuation-in-part of U.S. application Ser. No. 462,042, filed Jan. 8, 1990, now U.S. Pat. No. 5,043,582, which is a continuation-in-part of U.S. application Ser. No. 151,235, filed Feb. 1, 1988, now U.S. Pat. No. 4,905,265, which is a continuation-in-part of U.S. application Ser. No. 807,650, filed Dec. 11, 1985, now abandoned.

BACKGROUND OF THE INVENTION

1. Field of the Invention

This invention relates to x-ray imaging systems and to x-ray sensors for use in such systems.

2. Discussion of Related Art

U.S. Pat. No. 5,053,582 to Cox et al discloses the details of an x-ray imaging system and both a direct conversion solid state x-ray sensor and an x-ray sensor which uses a scintillator to convert x-ray band radiation into visible light. The entire disclosure of U.S. Pat. No. 5,053,582 is incorporated herein by reference.

FIG. 16 of the Cox et al. patent shows a unique configuration for an x-ray detector in which a scintillator is positioned in a sandwich structure between a layer containing sensor elements and a layer containing preprocessors. The outputs are taken from the sensors and passed through bump bonds extending through the scintillator to the preprocessors. This configuration has many advantages, However, it would be preferable if such a sandwich structure could be produced in which the sensors and preprocessors could be closer together.

Recently, optical detectors have been developed with MOS capacitors in an epitaxial layer on a substrate, in which the substrate has been thinned so that visible light can be detected by backlighting the detectors from the substrate side rather than illuminating the MOS capacitors directly. This type of detector is discussed, for example, in "Optimizing charge-coupled detector operation for optical astronomy" by Robert W. Leach, *Optical Engineering*, 26(10), pgs. 1061–1066, October 1987.

SUMMARY OF THE INVENTION

One object of the present invention is to provide an x-ray detector which has a high quantum efficiency to detect low x-ray doses.

Another object of the present invention to provide an x-ray detector which has the capability of withstanding a large number of exposures without undergoing a degradation in performance.

In accordance with the above and other objects, the invention comprises a scintillator for converting impinging x-rays into visible light; a sensor array having two opposed surfaces with a plurality of detectors at one of the surfaces and having the other of the surfaces facing the scintillator; and a plurality of processing circuits facing the one surface and connected to the detectors by bump bonds.

In accordance with other aspects of the invention, the bump bonds each comprises a first bump on the sensor array, a second bump on the processing circuits and a third bump therebetween.

In accordance with other aspects of the invention, the scintillator comprises a glass plate doped with a phosphor. Alternately, the scintillator may be in the form of a fiber optic fiber, the core of which is doped with a phosphor. Another possibility is that the scintillator is in the form of a crystal phosphor deposited on the sensor array.

The device may also include a first mechanical support connected to the phosphor and a second mechanical support connected to the processing circuits.

Sense and data lines for the detector may be positioned between the sensor array and the processing circuits.

In accordance with other aspects of the invention, the detector comprises a plurality of semiconductor sensors comprising respective MOS capacitors; a gain stage in close proximity to each of the semiconductor sensors for receiving and amplifying charges from the MOS capacitors; and switches positioned to direct charge from the MOS capacitors to the gain stages. A separate gain stage may be provided for each MOS capacitor or one gain stage can be connected to different ones of the capacitors through the switches.

There also may be a circuit for connecting several of the capacitors to one gain stage to add the outputs from the several capacitors and produce a lower resolution real time image, or to connect the several capacitors sequentially to the gain stage to produce a higher resolution static image.

The gain stage preferably comprises a capacitor having a smaller capacitance than the capacitor in the sensor.

The device also includes a circuit for transferring packets of charge from a sensor to a gain stage several times during one exposure cycle.

BRIEF DESCRIPTION OF THE DRAWINGS

The above and other objects of the invention will become more readily apparent as the invention becomes more fully understood from the detailed description to follow, reference being had to the accompanying drawings in which like reference numerals represent like parts throughout, and in which.

DETAILED DESCRIPTION OF THE PREFERRED EMBODIMENTS

As discussed above, U.S. Pat. No. 5,043,582 to Cox et al., incorporated herein by reference, discloses a number of sensor architectures with a detailed discussion of their operation and use in a complete system. These architectures operate satisfactorily to collect charge to form an image. However, there is always a need to improve the operation of such sensors. Disclosed herein are a number of different devices which can be used in the Cox et al system.

One sensor architecture of the Cox et al. patent is depicted in FIG. 16 of the patent. This sensor comprises a sensor array formed of MOS capacitors which face a scintillator. On the opposite side of the scintillator is a preprocessor array. In order to improve the charge collection and transfer capabilities of the Cox et al sensor, a more sophisticated pixel architecture is required. The MOS capacitor has excellent detector capabilities and can efficiently collect charge generated as a result of x-ray interaction within the absorber layers. However, it is equally important to be able to efficiently transfer that charge to the preprocessor arrays for digitization and processing. The amount of charge collected by each capacitor is very small and must be transported large distances (by semiconductor standards) to the preprocessor array. The charge transfer efficiency of the sensor array can be improved by the addition of a gain stage and impedance matching elements within the pixel. By amplifying the voltage produced by the charge collected on the MOS capacitor, a larger signal will be transferred. By matching the impedance of the pixel to the sense line, a more efficient charge transfer will occur. These changes will improve the performance of the device substantially.

Figure 1:
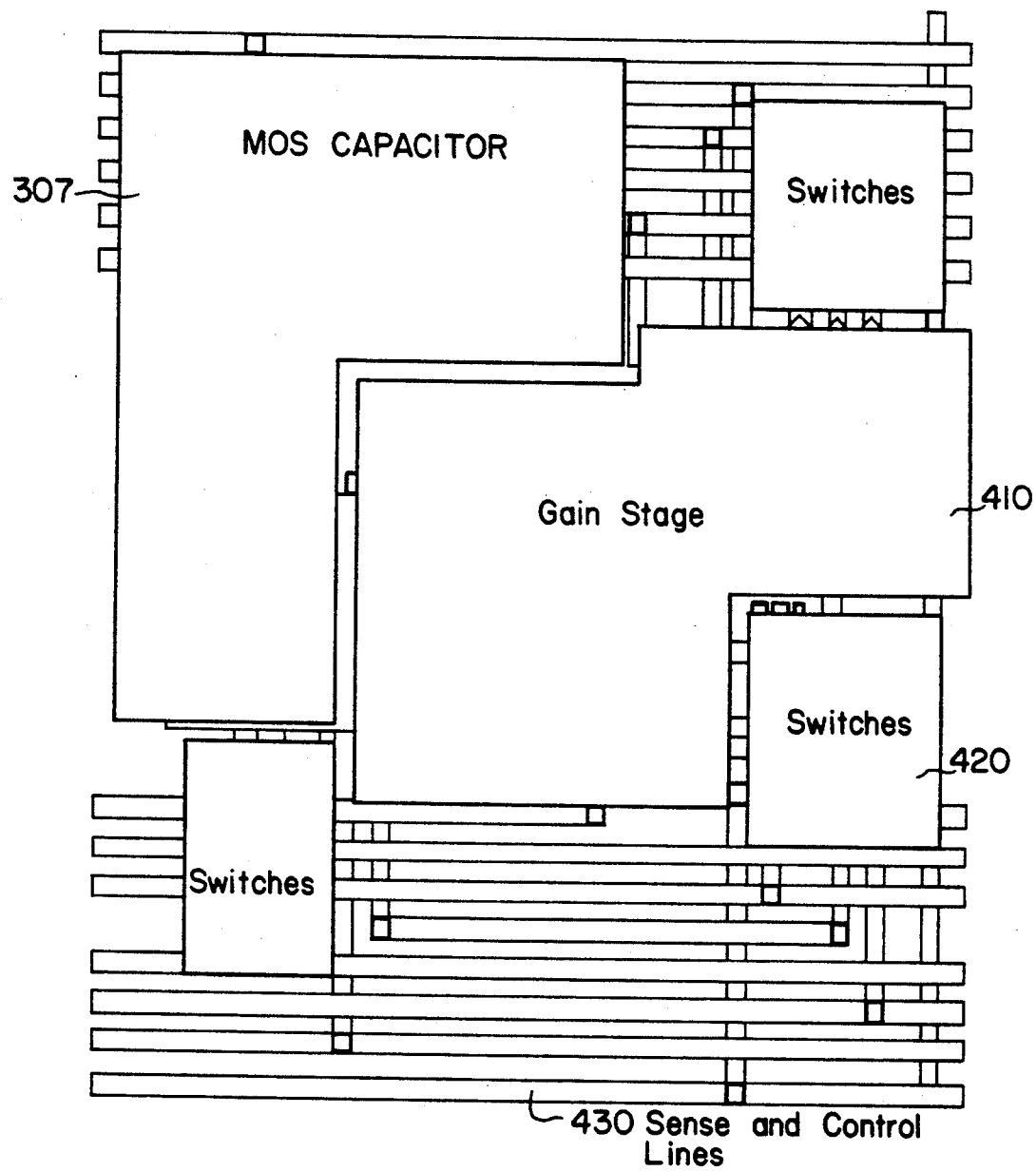
FIG. 1 is a plan view of an x-ray pixel configuration according to the present invention.
Figure 2:
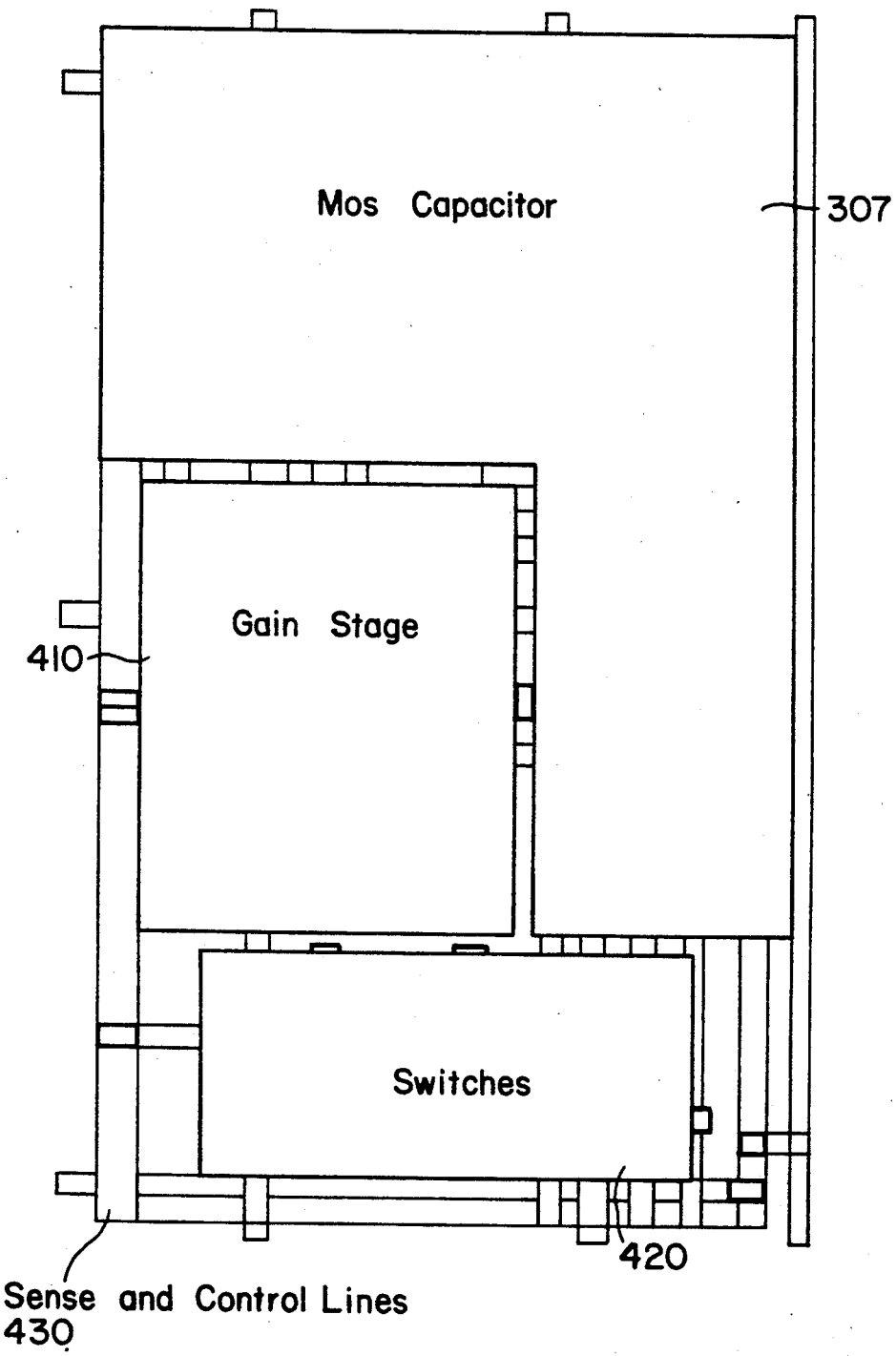
FIG. 2 is a plan view of another x-ray pixel configuration according to the present invention.

A diagram of the improved pixel architecture is shown in FIG. 1. As shown, the pixel area is shared by the MOS capacitor 307, the gain stage 410, a set of switches 420 and the required sense and control lines 430. The added pixel components improve the charge transfer efficiency of the pixel at the expense of fill factor. Fill factor is the ratio of the sense area (i.e., MOS capacitor area) of the pixel to its total area. Clearly, a higher fill factor will improve the sensitivity and charge collection efficiency of the pixel. A balance must be struck between improved charge transfer efficiency and reduced charge collection efficiency (sensitivity). It is therefore important to provide the improved charge transfer efficiency capabilities to the pixel without greatly reducing its fill factor. FIG. 2 shows a pixel architecture with a higher fill factor. This is accomplished by utilizing smaller components that may not produce the best charge transfer characteristics but have improved fill factor and sensitivity characteristics. The larger components used in the embodiment of FIG. 1 could, for example, be operational amplifiers. These take up substantial space but have very good transfer characteristics. The smaller components used in the embodiment of FIG. 2 could be inverters. These take up considerably less space but have poorer charge transfer characteristics.

Figure 3:
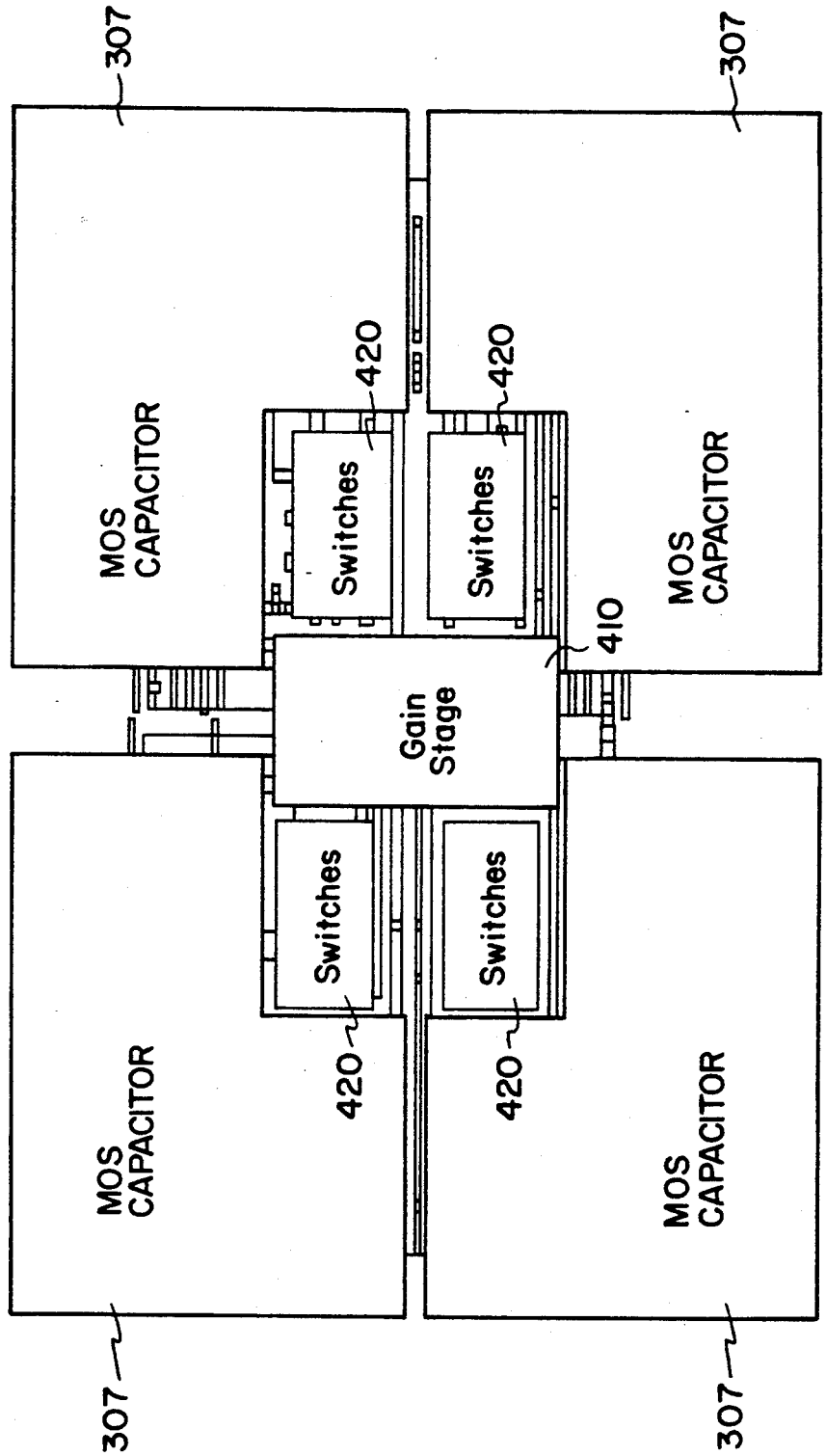
FIG. 3 is a plan view of a third x-ray pixel configuration according to the present invention.

In yet another embodiment of the improved pixel architecture, the gain stage 410, switches 420 and sense and control lines 430 are shared by neighboring pixels. In FIG. 3, a 2×2 pixel ensemble is shown where the gain stage 410 is placed in the center of four neighboring pixels and is connected through switches 420 to the four MOS capacitors 307. In this shared amplifier configuration, the fill factor can be even further improved and yet another advantage can be gained, namely, that the neighboring pixels can be summed and averaged or can be read out sequentially. The advantages of this configuration are that the device can be read out at high speed when all four pixels are averaged together to produce a lower resolution real-time (i.e., 30 frames per second) image or the pixels can be read out sequentially for a higher resolution static image. Now the device is capable of producing two types of x-ray imaging techniques (high resolution static and lower resolution real-time).

Figure 4:
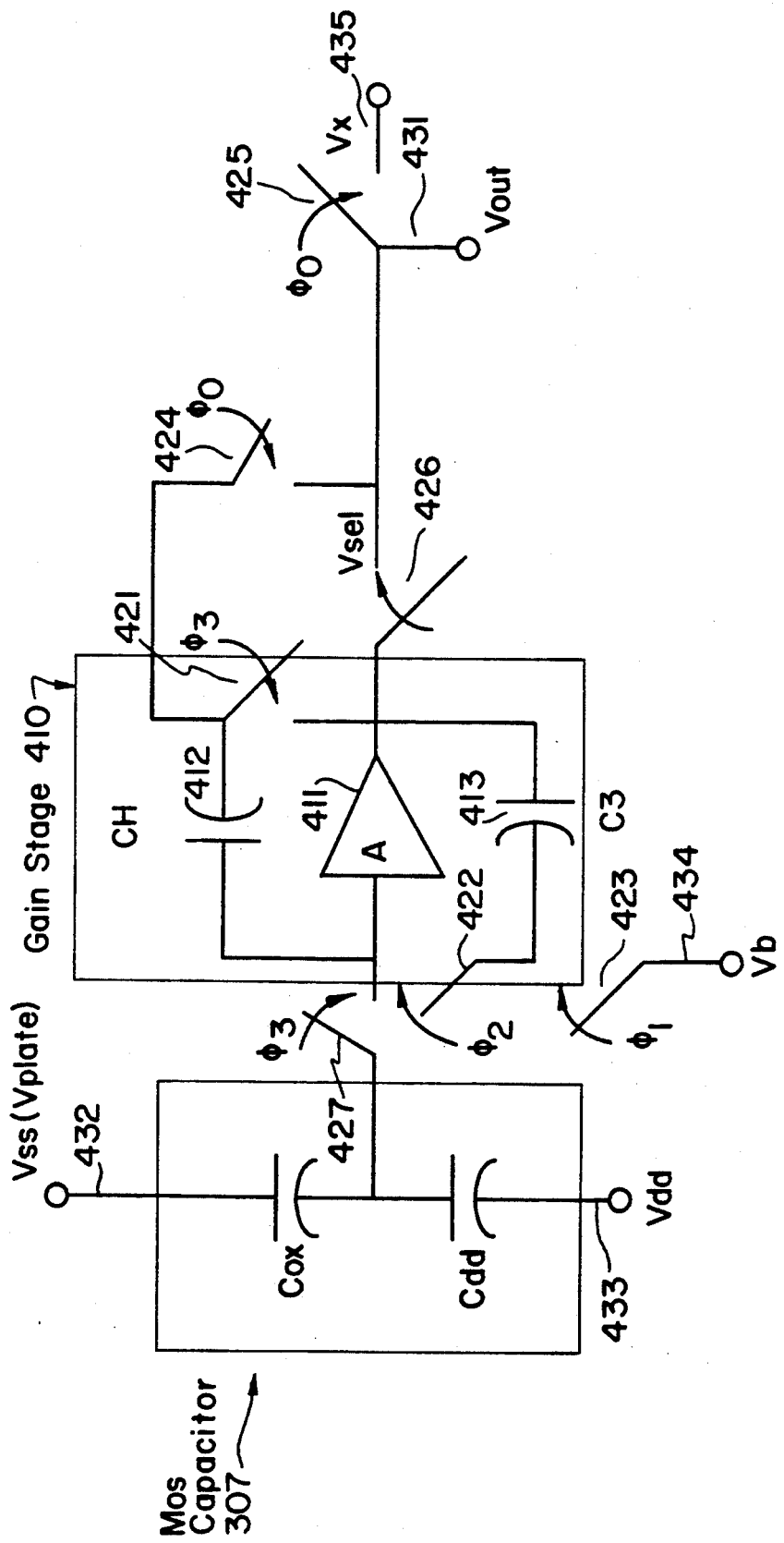
FIG. 4 is a schematic representation of an equivalent circuit for a pixel according to the present invention.

A schematic of the improved pixel architecture is shown in FIG. 4. As shown, the MOS capacitor 307 is modeled as two capacitors in series (the capacitance of the oxide layer and the substrate have distinct properties that require two separate capacitors to adequately describe). The Mos capacitor is connected to the gain stage 410 by switch 427. In the embodiment having several MOS capacitor connected to the same gain stage, plural switches 427 would be provided. The gain stage 410, is shown as an operational (Op) amplifier 411 connected to a storage capacitor (CH) 412 and a feedback capacitor (C3) 413 by a set of switches 421. The gain stage 410 is connected in turn to the MOS capacitor 307 and sense line 431 by switches 422, 423, 424, 425 and 426. Control lines 432 and 433 supply power to the MOS capacitor 307. Control line 434 is used to charge the storage capacitor 412. Control line 435 is used to address the pixel. The gain from the gain stage is principally obtained by the ratio of capacitances between the MOS capacitor 307 and the storage capacitor 412. The capacitance of the MOS capacitor is on the order of 10 to 20 times larger than that of the storage capacitor. Thus, when charge is transferred between the two, the quantity of charge in the storage capacitor produces a larger voltage than in the MOS capacitor.

Because of the smaller capacitance of the storage capacitor 412, impedance matching with the data line becomes necessary. This impedance matching is effected by the feedback capacitor 413. Capacitor 413 also assists in the readout of data from the gain stage as well as reduces the slew rate requirement of the operational amplifier 411. In addition, capacitor 413 improves the finite gain sensitivity of the operational amplifier 411.

The gain circuit 410 together with its associated switches form an offset compensated switched capacitor circuit. The details of such a circuit are set forth in U.S. Pat. No. 4,543,534 to Temes et al., which is hereby incorporated by reference.

As discussed above, operational amplifier 411 as shown in FIG. 4 is used in the embodiment of FIG. 1. Smaller components such as an inverter may be used in the embodiment of FIG. 2. In either case, the ratio between the MOS capacitor and the storage capacitor determines the gain. Also, in either case, impedance matching is needed.

Since the storage capacitor 412 stores charge during the exposure interval, it is important that the capacitor be insensitive to light generated by the phosphor. To accomplish this, the storage capacitor 412 should have both of its electrodes made out of polysilicon creating what is known as a double-poly capacitor. These types of capacitors are relatively insensitive to radiation. The fact that the sensor arrays 404 are illuminated from the substrate or back side further isolates the storage capacitor 412 from radiation since it does not reside on or in the substrate or epitaxial layer. In other words, the double-poly capacitor is formed from two polysilicon electrodes grown on the epitaxial layer, removing it from the radiation on the back or substrate side.

Another concern about the overall sensing capabilities of the pixel is the performance of the gain stage 410. To optimize the performance of the op amp 411 within the gain stage it is important to reduce its slew-rate requirements. The feedback capacitor 413 in the gain circuit acts to limit the voltage swing the amplifier 411 must experience as it switches from state to state. To keep a high fill factor in the pixel 400 a simple gain stage is required to reduce the area occupied by non-sensing elements. This creates limitations on the gain-stage performance, necessitating low-gain amplifiers or simple inverters. The use of the feedback capacitor has the advantage when used with a low-gain amplifier that it reduces the signal loss that is normally experienced with low gain amplifiers.

Yet another concern about the sensing capabilities of the pixel 400 is the linearity of the MOS sensing capacitor 307. When charge is accumulated in the capacitor, the depletion layer shrinks, reducing the volume available for further charge collection. This results in a non-linear sensitivity since the ability of the capacitor to collect charge is related to the volume of its depletion region. One way to mitigate this problem is to shift the charge collected on the MOS capacitor 307 to the storage capacitor 412 many times during the exposure. Each time this is done, the MOS capacitor 307 is reset to its deep-depletion state, improving the linearity of its response to radiation. This technique is shown in the pixel charge-expose-read cycle in FIGS. 5a-5e.

Figure 5C:
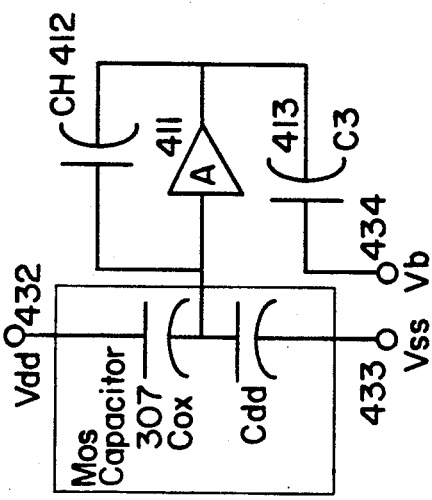
FIGS. 5a–5e show the charge-expose-read cycle of the pixel of FIG. 4.
Figure 5B:
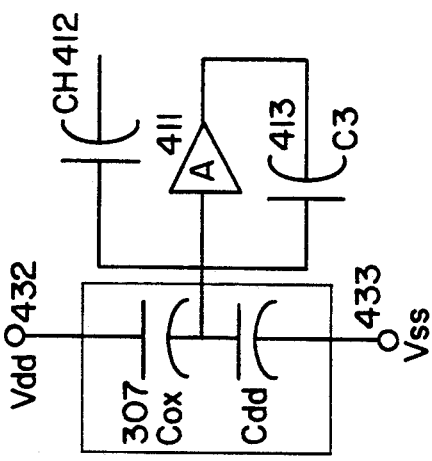
Figure 5A:
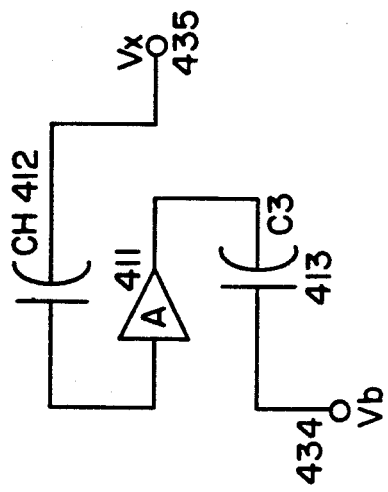
Figure 5E:
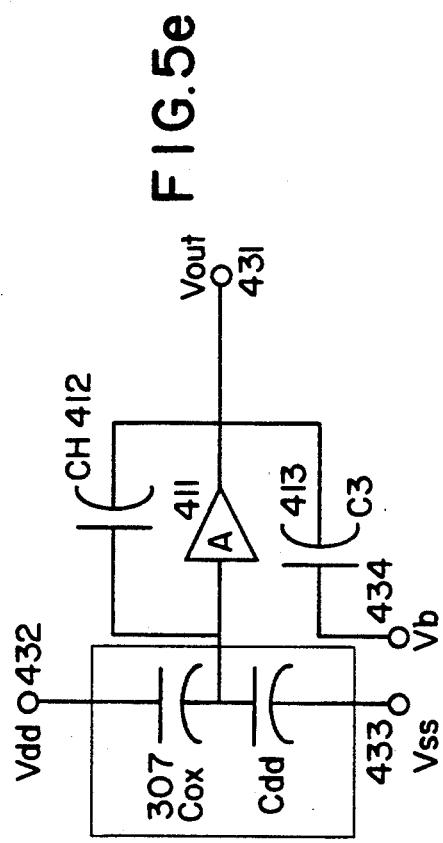
Figure 5D:
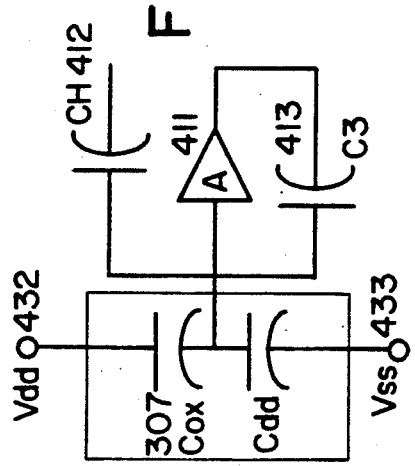

The pixel charge-expose-read cycle has five sequential steps. The first step is to precharge the storage capacitor 412, as shown in FIG. 5a. The second step is to precharge the MOS capacitor 307 as shown in FIG. 5b. The third step is to expose the MOS capacitor 307 to x-rays for the purposes of acquiring the image, as shown in FIG. 5c. The fourth step is to transfer packets of charge from the MOS capacitor 307 to the storage capacitor 412 many times during the overall expose portion of the charge-expose-read cycle, as shown in FIG. 5d. The fifth step is to read out the accumulated and amplified charge, as shown in FIG. 5e.

Figure 6:
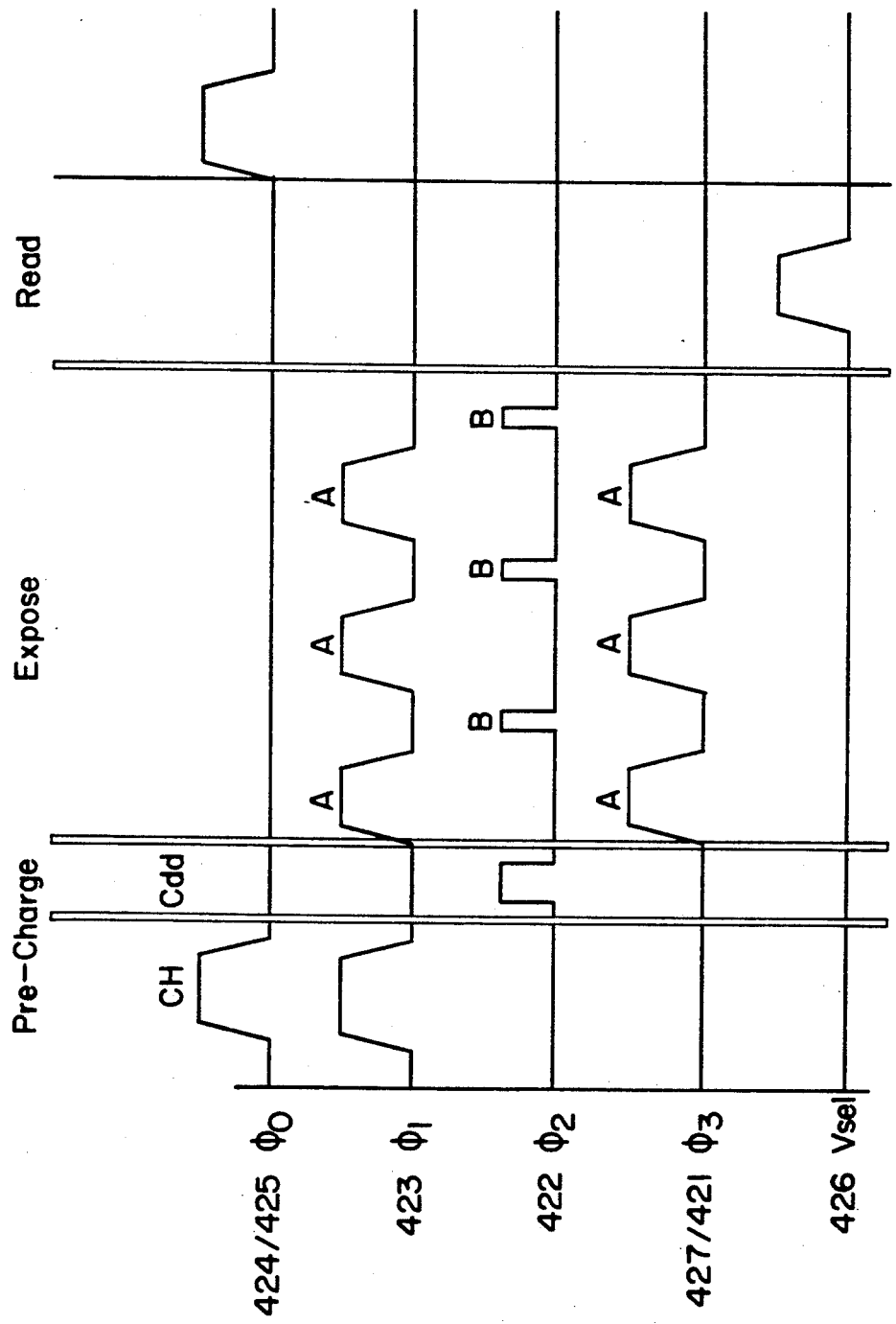
FIG. 6 is a timing chart for the charge-expose-read cycle of FIGS. 5a–5e.

FIG. 6 shows a timing diagram for the charge-expose-read cycle. As shown, there are six clocks, 421 through 426 that are switched on and off accordingly to produce the five stages of the cycle. Also shown is the relative amount of time spent for the two portions (A and B) of the exposure interval. The large majority of the time spent in the exposure interval is charge accumulation in the MOS capacitor, whereas only a small portion (<10 per cent) of the time is spent dumping charge onto the storage capacitor 412. This is done to minimize the amount of time required to obtain an image.

The improved pixel of the present invention can be used as the sensing element in the random access sensor disclosed in the Cox et al. patent FIG. 14, using the same row, column and signals lines used in regard to other pixel architectures. It will be understood by those skilled in the art that clock lines needed to implement the clock signals of FIG. 6 can easily be implemented using known technology. The manner of implementing control lines for effecting high resolution static or low resolution real time operation, discussed in connection with the embodiment of FIG. 3, would also be obvious to one skilled in the art.

The foregoing embodiments of the pixel architecture of the invention provide improved performance to the invention but further improvements to the sensitivity and longevity of the invention can be made by changing the architecture of device structure itself. Accordingly, the sensitivity and longevity of the sensor array is improved by reversing the positions of the phosphor and the sensor array as in detector 500 shown in FIG. 7 from those shown in FIG. 16 of the Cox et al. patent. In the configuration shown in FIG. 7, the phosphor is facing the x-ray source. In this configuration the phosphor thickness is not constrained by the fact that solder connectors need to be passed through it, as in the Cox et al. structure, limiting its practical thickness. Recent advances in phosphor doped fiberoptic plates have produced thick absorber plates that possess high resolution because of the light guiding properties of the fiberoptics. A thick phosphor that has high resolution is of particular interest to solid-state imaging applications where the added shielding properties of a thicker absorber are needed to protect the semiconductor components underneath while preserving high resolution imaging capabilities. The added shielding capabilities of the thicker phosphor in this configuration will increase the life of the sensing array, thus improving its cost competitiveness with other imaging modalities. The increased absorption properties of the thicker phosphor will improve the sensitivity of the sensor array, reducing the x-ray dose needed to obtain an image, producing yet another advantage particularly in medical applications where patient dose is of concern.

The thickness of the phosphor depends on the manner of its application. A fiber optic scintillator, in which the core of an optic is doped with a phosphor, can be on the order of 6-8 mm. This is an excellent type of scintillator for use in the present invention since the optic fiber guides the output to the sensor array with no light scattering. If a phosphor crystal is deposited on the back of the sensor array, the thickness of the phosphor layer would be on the order of 0.1-5 mm. Scintillator screens, on the other hand may be on the order of 2-3 mm.

Figure 7:
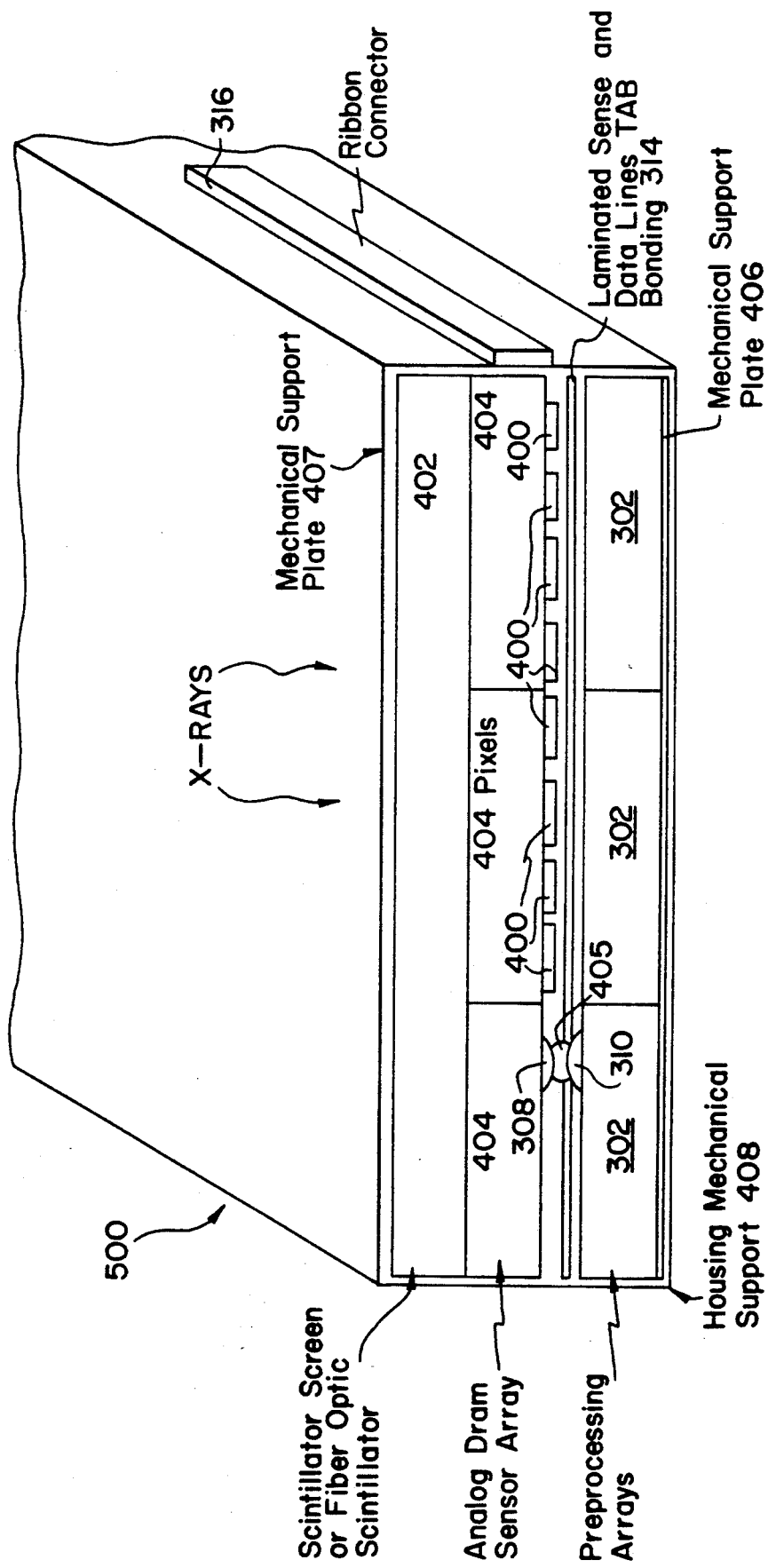
FIG. 7 is a cross sectional view of a detector configuration according to the present invention.

As shown in FIG. 7, the detector 500 comprises a first mechanical support 407, a preprocessor array having a plurality of preprocessor chips 302 mounted on the mechanical support 406, and sensor arrays 404 mounted directly on the phosphor 402. Each sensor array 404 contains a plurality of pixels 400 interconnected by control and sense lines 430 similar to the arrangement shown in FIG. 14 of the Cox et al. patent. Solder bumps 308 are connected to control and signal lines also depicted in FIG. 14 of Cox et al. with respect to solder bumps 208. The solder bumps 308 are connected to solder bumps 310 on the preprocessors via gold and/or solder connectors 405. This provides a multilayer structure wherein the MOS capacitors 307 can be randomly accessed yet be closely spaced by virtue of the solder bump connections which avoid "dead spaces" in the resulting image by communicating the control and sense lines of the sensor array out of the arrays to the preprocessors. The preprocessors 302 communicate externally of the detector 500 through tab bonded laminated sense and data lines 314. The tab bonding comprises a thin piece of plastic with the sense and data lines laminated therein. The tab bonding connects to a ribbon connector 316 which connects to a processor such as a PC or other such image processor which extracts data and supplies power to the imager. The sense and data lines from the tab bonding may be attached to the preprocessor or may attach directly to solder bumps leading to the sensor arrays 404.

The foregoing characteristics of detector 500 are similar to the detector 300 of FIG. 16 of Cox et al., except that the sensor arrays 404 and the phosphor 402 are reversed (i.e., the phosphor is directly exposed to the x-rays whereas in detector 300 the sensor array 304 is directly exposed to the x-rays). The other main difference between these structures is that the sensor array 404 has a thinned epitaxial layer and is back-lit by the phosphor 402. Thinning the epitaxial layer of a sensor array is a technique known in the art as a way of improving the sensitivity and quantum efficiency of a visible light detector. This process has the effect of making the detector array more expensive but is justified in many cases where the incident radiation is weak. In the case of x-ray imaging in the configuration of detector 500, the detector will have a much longer useful life and will be more sensitive, thus justifying the added expense. Moreover, the reversal of the sensor array 404 and the phosphor 402 eliminates any obstruction between the sensor array 404 and the preprocessor array 302 as is the case with detector 300. By removing the obstruction (the phosphor 320), it will be much easier to make the required connections between the sensor array 404 and the preprocessor 302.

The sensor of the present invention is produced with an epitaxial layer on a substrate, similar to that shown in FIG. 13 of the Cox et al patent except without the extra absorber. The substrate is removed and the epitaxial layer is grown to a maximum or is thinned to a maximum of 20 microns. The epitaxial layer should be doped to provide a 20 Ohm-cm resistance.

Because the MOS capacitors in the present embodiment are illuminated through the thinned epitaxial layer of the sensor array, it is no longer important that the top surface of the capacitor be unobstructed. All of the required circuits can be routed over the capacitors or any other structure in the sensor array 404. This is an important advantage that will permit the sense and control lines 430 to be routed in such a way as to reduce the path length required to connect the circuits together.

The sensor arrays 404 are preferably arrays of pixels 400 which consist of many individual array panels containing hundreds or thousands of sensors. Each of the sensor arrays is on the order of one to two inches on a side containing the pixels 400 and all the required sense and control lines 430 and bond pads. The individual one or two inch sensing arrays 404 are glued onto the phosphor 402 with the thinned epitaxial surface of the sensor array 400 facing the output surface of the phosphor 402. The other side of the phosphor 402 facing the x-rays is attached to the thin metal support plate 407. The sensor arrays 404 are precision machined so that they may be butted together as close as possible forming a gap between neighboring pixels 400 on adjacent arrays no larger than 200 microns. The individual pixels 400 on the sensing arrays 404 are placed on 50 to 100 micron centers with a capacitor size on the order of 25 to 50 microns on a side or thereabout.

The tab bonding 314 is positioned between the sensor arrays 404 and the preprocessors 302 so that it may connect to the preprocessors 302 and/or connect directly to the sensor arrays 404 through solder bumps 308.

The entire assembly comprising sensing arrays 404, phosphor 402, tab bonding 314 and preprocessors 302 attached to support plates 405 and 406 is placed in a mechanical housing 408 containing the necessary structural supports, stand offs and other necessary components for mechanical stability. The overall size of the cassette is on the order of 14"×17" in the length and width dimensions and has a thickness on the order of one half inch. Ribbon connector 316 is attached to housing 408.

The foregoing description is provided for purposes of illustrating the present invention but is not deemed limitative thereof. Clearly, numerous additions, substitutions and other changes can be made to the invention without departing from the scope thereof as set forth in the appended claims.

What is claimed is:

1. An x-ray imaging apparatus, comprising:
   a scintillator for converting impinging x-rays into visible light and providing shielding to following layers from x-rays;
   a sensor array having two opposed surfaces with a plurality of detectors at one of said surfaces and having the other of said surfaces facing said scintillator for receiving visible light from said scintillator and for being shielded from x-rays by said scintillator;
   a plurality of processing circuits on a processing circuit array facing said one surface and connected to said detectors by solder bonds.

2. An apparatus as claimed in claim 1 wherein said solder bonds each comprises a first bump on said sensor array, a second bump on said processing circuit array and a third bump therebetween.

3. An apparatus as claimed in claim wherein said scintillator comprises a glass plate doped with a phosphor.

4. An apparatus as claimed in claim wherein said scintillator comprises an optic fiber having a core doped with a phosphor.

5. An apparatus as claimed in claim wherein said scintillator comprises a phosphor crystal.

6. An apparatus as claimed in claim 1 further including a first mechanical support connected to said scintillator.

7. An apparatus as claimed in claim 6 further including a second mechanical support connected to said processing circuit array.

8. An apparatus as claimed in claim 1 further including sense and data lines positioned between said sensor array and said processing circuit array.

9. An apparatus as claimed in claim 1 wherein said sensor array is formed on a semiconductor layer with a thickness no greater than 20 microns.

10. An apparatus as claimed in claim 9 wherein said semiconductor layer is a single crystal epitaxial layer.

11. An x-ray imaging apparatus, comprising:
    a plurality of semiconductor sensors;
    a gain stage employing feedback in close proximity to each of said semiconductor sensors for receiving, buffering and amplifying charges from said semiconductor sensors; and
    switches position to direct charge from said semiconductor sensors to said gain stages.

12. The apparatus as claimed in claim 11 comprising a separate gain stage employing feedback for each semiconductor sensor.

13. The apparatus as claimed in claim 11 wherein one gain stage can be connected to different ones of said semiconductor sensors through said switches.

14. An apparatus as claimed in claim 11 wherein said gain stage comprises an offset compensated switched capacitor circuit.

15. An x-ray imaging apparatus, comprising:
    a plurality of semiconductor sensors;
    a gain stage in close proximity to each of said semiconductor sensors for receiving and amplifying charges from said semiconductor sensors;
    switches positioned to direct charge from said semiconductor sensors to said gain stages; and means for connecting several of said semiconductor sensors to one gain stage to add the outputs from said several semiconductor sensors and produce a lower resolution real time image, or to connect said several semiconductor sensors sequentially to said gain stage to produce a higher resolution static image.

16. An x-ray imaging apparatus, comprising:
a plurality of semiconductor sensors comprising respective MOS capacitors;
a gain stage in close proximity to each of said semiconductor sensors for receiving and amplifying charges from said MOS capacitors; and
switches positioned to direct charge from said MOS capacitors to said gain stages;
wherein each sensor comprises a sensor capacitor and each gain stage comprises a storage capacitor having a smaller capacitance than the sensor capacitor.

17. The apparatus as claimed in claim 16 comprising means for transferring packets of charge from said sensor capacitor to said gain stage capacitor several times during an exposure cycle.

18. The apparatus as claimed in claim 17 wherein said means for transferring carries out said transfer in the following steps:
precharge the sensor capacitor;
precharge the storage capacitor;
expose the sensor capacitor;
transfer charge from the sensor capacitor to the storage stage capacitor a number of times during an exposure cycle;
read the gain stage capacitor.

19. An apparatus as claimed in claim 16, wherein said storage capacitor is a double-poly capacitor to make it relatively insensitive to radiation.

20. An apparatus as claimed in claim 15 wherein each sensor has a front side containing a double poly storage capacitor and a back side and wherein the sensors are irradiated from the back side so that the storage capacitors are isolated from the radiation.

21. A x-ray imaging apparatus, comprising:
a plurality of semiconductor sensors;
a gain stage in close proximity to each of said semiconductor sensors for receiving and amplifying charges from said semiconductor sensors; and
switches positioned to direct charge from said semiconductor sensors to said gain stages; and
means for transferring packets of charge from a sensor to a gain stage several times during one exposure cycle.

22. An x-ray imaging method, comprising:
converting impinging x-rays into visible light by irradiating a scintillator which backlights a sensor array formed on an epitaxial layer having a front surface with a plurality of detectors and having a back surface facing said scintillator such that visible light from said scintillator is received by said sensor and said scintillator shields said detectors from said x-rays;
outputting signals from said detector array through a plurality of solder bonds connected between said sensor array and a plurality of processing circuits on a processing circuit array facing said front surface.

23. An x-ray imaging method, comprising:
reading the charge accumulated by a light sensor at each of a plurality of read cycles;
transferring charge from a sense capacitor to a storage capacitor of a gain stage which is in close proximity to said light sensor a plurality of times during each of said read cycles; and
reading said charge from said storage capacitor once for every plurality of transfers to said storage capacitor.

24. An x-ray imaging apparatus, comprising:
a semiconductor sensor;
a gain stage in close proximity to said semiconductor sensor for receiving and amplifying charges from said semiconductor sensor; and
means for reading out a charge on said semiconductor sensor at varying times to make the readout time flexible in length and not dependent on physical processes to which the apparatus is exposed.

25. An x-ray imaging apparatus, comprising:
a semiconductor sensor;
a gain stage employing feedback in close proximity to said semiconductor sensor for receiving, buffering and amplifying charges from said semiconductor sensor; and
means for reading out charge stored on the semiconductor sensor;
wherein the feedback and characteristics of the gain stage permit said charge to be read out after an exposure cycle without altering said charge.

* * * * *